United States Patent [19]

Watari et al.

[11] Patent Number: 5,522,034
[45] Date of Patent: May 28, 1996

[54] BATTERY DISCONNECTION DETECTING APPARATUS

[75] Inventors: Daisuke Watari, Kariya; Takaaki Baba, Anjo; Shogo Kameyama, Chiryu, all of Japan

[73] Assignee: Nippondenso Co., Ltd., Kariya, Japan

[21] Appl. No.: 290,693

[22] Filed: Aug. 15, 1994

[30] Foreign Application Priority Data

Aug. 20, 1993 [JP] Japan .................................. 5-206672

[51] Int. Cl.⁶ ........................................... G06F 11/00
[52] U.S. Cl. ................... 395/182.20; 307/10.7; 307/46; 307/66; 395/750
[58] Field of Search ................... 395/575, 182.12, 395/182.20, 750; 307/9.1, 10.7, 23, 46, 66; 364/431.05, 431.11, 285

[56] References Cited

U.S. PATENT DOCUMENTS

| | | | |
|---|---|---|---|
| 4,715,344 | 12/1987 | Tomisawa | 123/489 |
| 4,742,482 | 5/1988 | Inskeep et al. | 364/900 |
| 4,749,873 | 6/1988 | Mutoh et al. | 307/10 AT |
| 4,758,914 | 7/1988 | Ishii | 360/75 |
| 4,764,729 | 8/1988 | Yakuwa et al. | 324/546 |
| 4,864,998 | 9/1989 | Onishi | 123/489 |
| 4,869,474 | 9/1989 | Best et al. | 267/136 |
| 5,195,100 | 3/1993 | Katz et al. | 371/66 |
| 5,392,438 | 2/1995 | Gunji | 395/750 |

FOREIGN PATENT DOCUMENTS

| | | |
|---|---|---|
| 59-200351 | 11/1984 | Japan . |
| 64-11966 | 2/1989 | Japan . |
| 236003 | 8/1990 | Japan . |
| 2306351 | 12/1990 | Japan . |
| 333566 | 7/1991 | Japan . |
| 3186655 | 8/1991 | Japan . |

*Primary Examiner*—Robert W. Beausoliel, Jr.
*Assistant Examiner*—Dieu-Minh Le
*Attorney, Agent, or Firm*—Cushman, Darby & Cushman

[57] ABSTRACT

Disclosed is a battery disconnection detecting apparatus which can accurately detect whether or not the interruption of electric power supply from a battery to a storage device is continuously caused by the disconnection of an electric power line, or the like. The voltage of a battery is continuously supplied to a backup RAM through a second electric power line. An EEP-ROM is provided which can hold the stored data even when electric power supply is interrupted. When a power switch is turned ON, and an ECU is operative, a CPU detects the interruption of the electric power supply through the second electric power line based on the state of a standby bit. After detecting the interruption of the electric power supply, the CPU makes the count of the counter in the EEP-ROM count up. When the count reaches or exceeds the preset number n, i.e., when the CPU detects the interruption of the electric power supply consecutively for the preset number of times n or more, it is judged that the interruption of the electric power supply is continuously caused by the disconnection of the second electric power line.

16 Claims, 4 Drawing Sheets

BATTERY DISCONNECTION DETECTING APPARATUS

BACKGROUND OF THE INVENTION

The present invention generally relates to a battery disconnection detecting apparatus, particularly to a battery disconnection detecting apparatus for use in a vehicle which has storage devices or semiconductor memories to store and hold data with electric power supplied thereto from a battery.

A conventional electronic control unit (ECU) for an engine of a vehicle, for example, is so designed as to learn various control constants for suitably controlling the engine based on the learned control constants when the engine is in operation after an ignition switch (IG switch) is turned ON. These learned control constants are updated and stored in a random access memory (RAM) whenever necessary when the engine is in operation. The RAM is composed of a nonvolatile memory which holds the stored control constants as long as electric power is supplied thereto from a battery. In this arrangement, even when the IG switch is turned OFF and the engine is stopped, the newest learned control constants computed most lately is continuously held in the RAM. Accordingly, when the IG switch is turned ON again and the engine is restarted, the engine can be controlled based on the newest leaned control constants computed during the previous operation of the engine. In this way, by reflecting the newest learned control constants computed during the previous operation of the engine in the control of the engine started next time, the engine can be controlled always suitably.

For an electric power circuit for vehicles, one example has been disclosed in the Japanese Examined Utility Model Publication No. 3-33566, for instance. In this prior art, to a central processing unit (CPU) is connected to a battery through an IG switch, so that electric power is supplied from a battery to the CPU when the IG switch is turned ON. On the other hand, a RAM for storing data including learned control constants is continuously supplied with electric power from the battery through an electric power supply route which is different from an electric power supply route to the CPU. In this prior art, however, even when the electric power supply route from the battery to the RAM is disconnected and the electric power supply to the RAM is interrupted, it is so arranged that, when the IG switch is turned ON, the electric power from the battery is supplied through a backup circuit to the RAM. According to the above prior art, therefore, even when the above disconnection is caused when the IG switch is turned ON, not only the CPU but also the RAM are supplied with electric power from the battery. As a result, the CPU judges that the RAM is in normal operation, and starts controlling the engine based on the data stored in the RAM.

According to the prior art disclosed in the above publication, even when the electric power supply route from the battery to the RAM is disconnected, when the IG switch is turned ON, the RAM is supplied with electric power. However, when the IG switch is turned OFF, electric power supply to the RAM is interrupted, and the data stored in the RAM is lost or destroyed. In this prior art, therefore, when the IG switch is turned ON again and the engine is restarted, the engine is controlled based not on the newest learned control constants computed during the previous operation of the engine but on the learned control constants destroyed by the interruption of the electric power supply. Therefore, a problem with the prior art in the event of the above disconnecting is that the newest learned control constants computed during the previous operation of the engine can not be reflected in controlling the engine when the engine is started next time, and therefore, the engine can not suitably be controlled particularly at the time when the engine is just started again.

When the interruption of the electric power supply is temporarily caused by the temporary removal of the battery for replacement, or the like, the engine can not properly be controlled only when the engine is started next time, which may not pose any serious problem. However, when the interruption of the electric power supply is continuously caused by the disconnection of the electric power line, the engine can not suitably be controlled whenever the engine is started, which may pose serious problems such as the degradation of exhaust emission whenever the engine is started again.

To solve the above problem, it is considered that an EEP-ROM could be used as a memory for storing such data as the learned control constants. The EEP-ROM can electrically write and erase data, and also can hold the stored data even when the electric power supply is interrupted. However, as the commercially available EEP-ROM can rewrite the data only for the limited number of times, a problem with this EEP-ROM is that it is not appropriate to apply the EEP-ROM as a memory to a case where the learned control constants therein are subjected to frequent rewriting.

SUMMARY OF THE INVENTION

It is a primary object of the present invention to obviate the above drawbacks.

It is another object of the present invention to provide a battery disconnection detecting apparatus, in which when an electric power supply from a battery to a storage device is interrupted, a judgement is correctly made whether or not the interruption is continuously caused by the disconnection of an electric power line, or the like.

According to the present invention, a first storage device is continuously supplied with electric power from a battery through a second electric power supply route, and stores and holds data regardless of the position of a power switch or ignition switch. When the power switch is turned ON, and electric power is supplied from the battery to the first storage element through a first electric power supply route, operation processing is performed by controlling means based on the data stored in the first storage device, and devices to be controlled are controlled. At this time, even when the power switch is turned OFF with new data made stored in the first storage device by the controlling means, the new data stored in the first storage device are continuously held. Therefore, when the power switch is turned ON again, the controlling means starts the operation processing based on the new data in the first storage device.

Here, when the electric power supply through the second electric power supply route is interrupted, the data stored in the first storage device is destroyed. When the power switch is tuned ON again, the controlling means starts improper operation processing based on the destroyed data. However, the interruption of the electric power supply is detected by an interruption detection circuit, and the results of the detection are stored in the second storage device with electric power supplied through the first electric power supply route. The second storage device holds the data even when the electric power supply is interrupted, and a judgement can be made based on the data held in the second storage device whether or not the interruption of the electric power supply is continuously caused by the disconnection of the second electric power route, or the like. For instance, whenever the power switch is turned ON and electric power is supplied through the first electric power supply route, the interruption of the electric power supply through the second electric power supply route is detected, and the results of the detection are stored in the second storage element. When the number of times of storing the results reaches or exceeds the preset number, i.e., when the interruption of the electric power supply is detected consecutively for the preset number of times or more, it is judged that the interruption of the electric power supply is continuous, and the disconnection of the second electric power supply route is detected.

By detecting the disconnection of the second electric power supply route as described above, it becomes possible to notify the disconnection and, whenever the power switch is turned ON, to prevent the controlling means from starting improper operation processing based on the destroyed data in the first storage device.

DETAILED DESCRIPTION OF THE PREFERRED EMBODIMENTS

The first embodiment according to the present invention will now be described referring to FIGS. 1, 2 and 3A–3E.

Figure 1:
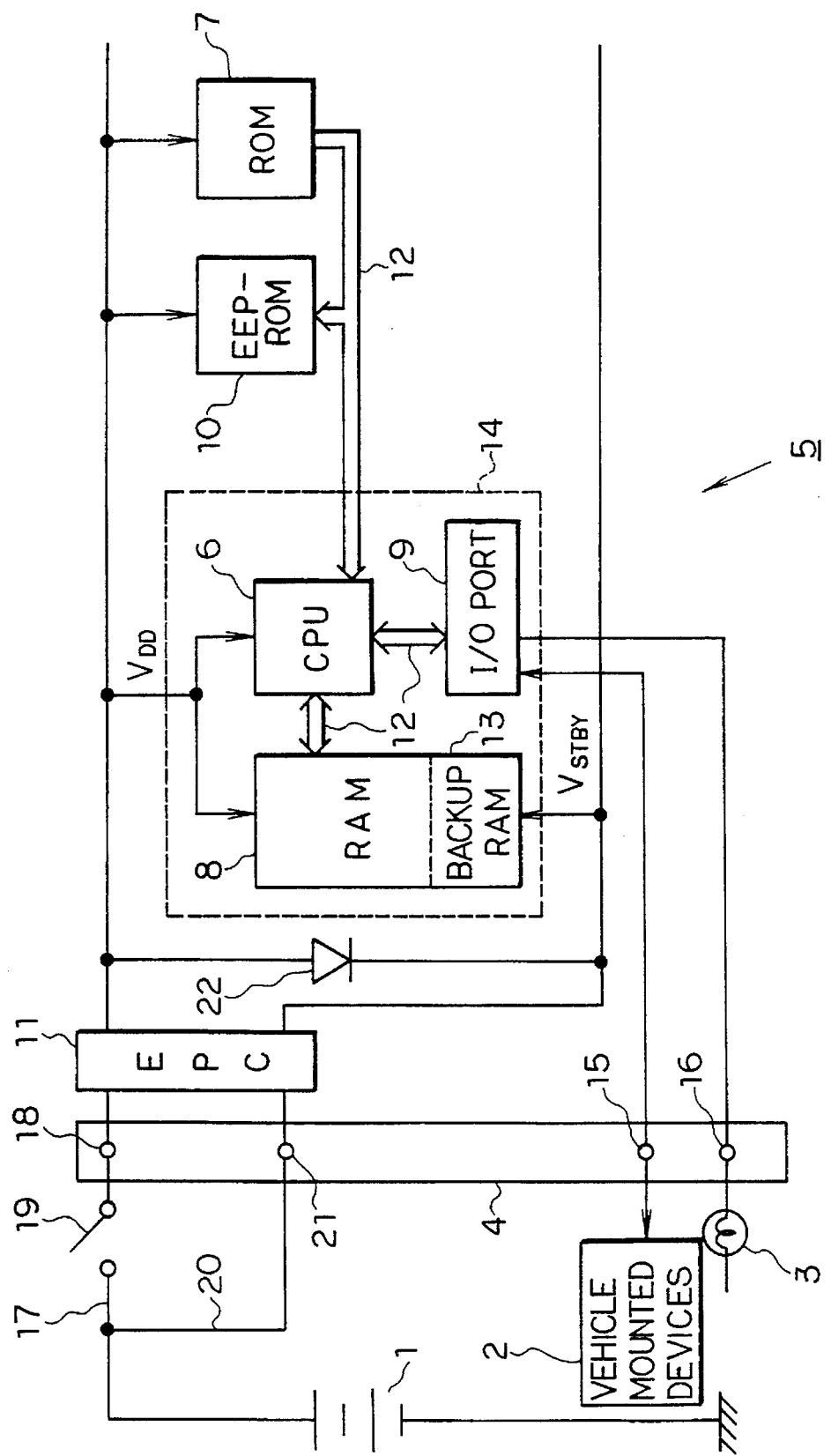
FIG. 1 is an electric circuit diagram illustrating a first embodiment of a battery disconnection detecting apparatus according to the present invention.

As illustrated in FIG. 1, a storage battery 1 and devices 2 to be controlled are mounted in a vehicle. A warning lamp 3 is disposed, for instance, on an instrument panel (not illustrated) in a vehicle compartment. The battery 1, the devices 2 and the warning lamp 3 are electrically connected to an electronic control unit (ECU) 5 through a connector 4. In this embodiment, the devices 2 include, for instance, a fuel injector mounted on a vehicle engine, and various sensors (not illustrated) are provided on the engine to detect the operating condition of the engine. The ECU 5 controls quantity, timing, etc. of the fuel injection of the fuel injector according to the operating conditions of the engine detected by the sensors.

The above ECU 5 includes a central processing unit (CPU) 6, a read-only memory (ROM) 7 which has stored data in advance including the engine control program, a random-access memory (RAM) 8 for temporarily storing data including the results of the operation processing-performed by the CPU 6, an input/output (I/O) port 9, an EEP-ROM 10 as a second storage device which can electrically write and erase data, and an electric power circuit (EPC) 11. The EEP-ROM 10 is a memory which can hold the stored contents even when the electric power supply is interrupted. The RAM 8, the I/O port 9, the ROM 7 and the EEP-ROM 10 are connected to the CPU 6 through buses 12 respectively. The RAM 8 includes a backup RAM 13 as a first storage device for storing and holding data when electric power is being supplied. The CPU 6, the RAM 8, the I/O port 9 and the backup RAM 13 compose a controller 14. To the I/O port 9 are connected the devices 2 and the warning lamp 3 through a first terminal 15 and a second terminal 16 of the connector 4, respectively.

A first electric power line 17 as a first electric power supply route is connected at one end to the above battery 1 and at the other end to the electric power circuit 11 of the above ECU 5 through a third terminal 18 of the above connector 4. An ignition switch (IG switch) 19 as a power switch is disposed in the first electrical power line 17, which is turned ON/OFF by the operation of an ignition key (not illustrated). When the IG switch 19 is turned ON for vehicle driving and the voltage from the battery 1 is supplied to the electric power circuit 11, the electric power circuit 11 stabilizes the supplied voltage to the preset voltage VDD and outputs the voltage to the above CPU 6, the RAM 8, the ROM 7 and the EEP-ROM 10 respectively to make the ECU 5 operative.

A second electric power line 20 as a second electric power supply route is connected at one end to the battery 1 and at the other end to the above electric power circuit 11 through a fourth terminal 21 of the connector 4. The voltage from the battery 1 is always supplied to the electric power circuit 11, and the electric power circuit 11 stabilizes the supplied voltage to the preset voltage VSTBY and always outputs the voltage to the above backup RAM 13 to keep the backup RAM 13 always operative. In this arrangement, the backup RAM 13 can always store and hold data regardless of the position of the IG switch 19. Hereinafter, the outputted voltage VSTBY for holding the data of the backup RAM 13 is called as the "standby voltage VSTBY". It is noted that the standby voltage VSTBY is of almost the same in voltage level as the voltage VDD outputted to the above CPU 6, etc.

A diode 22 is connected in the above electric power circuit 11 between the output to the CPU 6, etc. and the output to the backup RAM 13, and disposed forward from the side of the output to the CPU 6, etc. toward the side of the output to the backup RAM 13. When the level of the standby voltage VSTBY outputted to the backup RAM 13 falls below the voltage VDD outputted to the CPU 6, etc., the outputted voltage VDD is outputted to the backup RAM 13 as the standby voltage VSTBY through the diode 22.

In this embodiment, the CPU 6, the ROM 7 and the RAM 8 compose controlling means. When the IG switch 19 is turned ON to start the engine, the voltage from the battery 1 is supplied through the first electric power line 17 to the ECU 5, whereby the ECU 5 is made operative. In this state, when the data of the operating condition of the engine from the devices (sensors) 2 is inputted through the I/O port 9 to the CPU 6, the CPU 6 processes the inputted data based on the engine control program in the ROM 7 and the data both in the RAM 8 and in the backup RAM 13. Then, the CPU 6 outputs the results of the operation processing through the I/O port 9 to the devices (actuators) 2 to control the engine suitables.

As known well in the art, when the engine is in operation, the CPU 6 learns various control constants for controlling the engine and inputs the learned control constants into the backup RAM 13. Then, during the operation of the engine, the CPU 6 updates the learned control constants and inputs the updated control constants into the backup RAM 13 whenever necessary. In short, the above operation processing is performed with the learned control constants reflected. When the IG switch 19 is turned OFF for stopping vehicle operation, the newest learned constants computed most recently are stored and held in the backup RAM 13. Then, when the IG switch 19 is turned ON again and the engine is restarted, the CPU 6 starts controlling the engine using the newest learned constants computed during the previous operation of the engine and stored and held in the backup RAM 13.

Also, in this embodiment, the CPU 6 and the ROM 7 compose interruption detecting means. The CPU 6 includes a status bit for indicating the operating condition of peripheral units. The status bit is so designed as to change from "1" to "0" when the standby voltage VSTBY outputted to the backup RAM 13 falls below the reference level for the preset time period. Hereinafter, the status bit for indicating the state of the standby voltage VSTBY is called as the "standby bit."

When the standby voltage VSTBY inputted to the backup RAM 13 falls below the reference level for preset time due to, for example, the temporary removal of the battery 1 for replacement, or the like, disconnection in the second electric power line 20 or the intermittent contact of the fourth terminal 21, the standby bit of the CPU 6 changes from "1" to "0". Accordingly, in this state, when the IG switch 19 is turned ON and the ECU 5 is made operative, the CPU 6 detects the interruption of the electric power supply through the second electric power line 20 according to the change in the standby bit from "1" to "0".

Furthermore, in this embodiment, the CPU 6 and the ROM 7 compose disconnection detecting means. When the CPU 6 detects the above-described interruption of the electric power supply, the CPU 6 makes the counter built in the EEP-ROM 10 count up. When the count reaches or exceeds the preset number n or more, i.e., when the interruption of the electric power supply is detected consecutively for the preset number of times n, CPU 6 judges that the interruption of the electric power supply is continuously caused by the disconnection of the second electric power line 20, or the like.

Next, the operational principle of the battery disconnection detecting apparatus in the above composition will be described.

Figure 2:
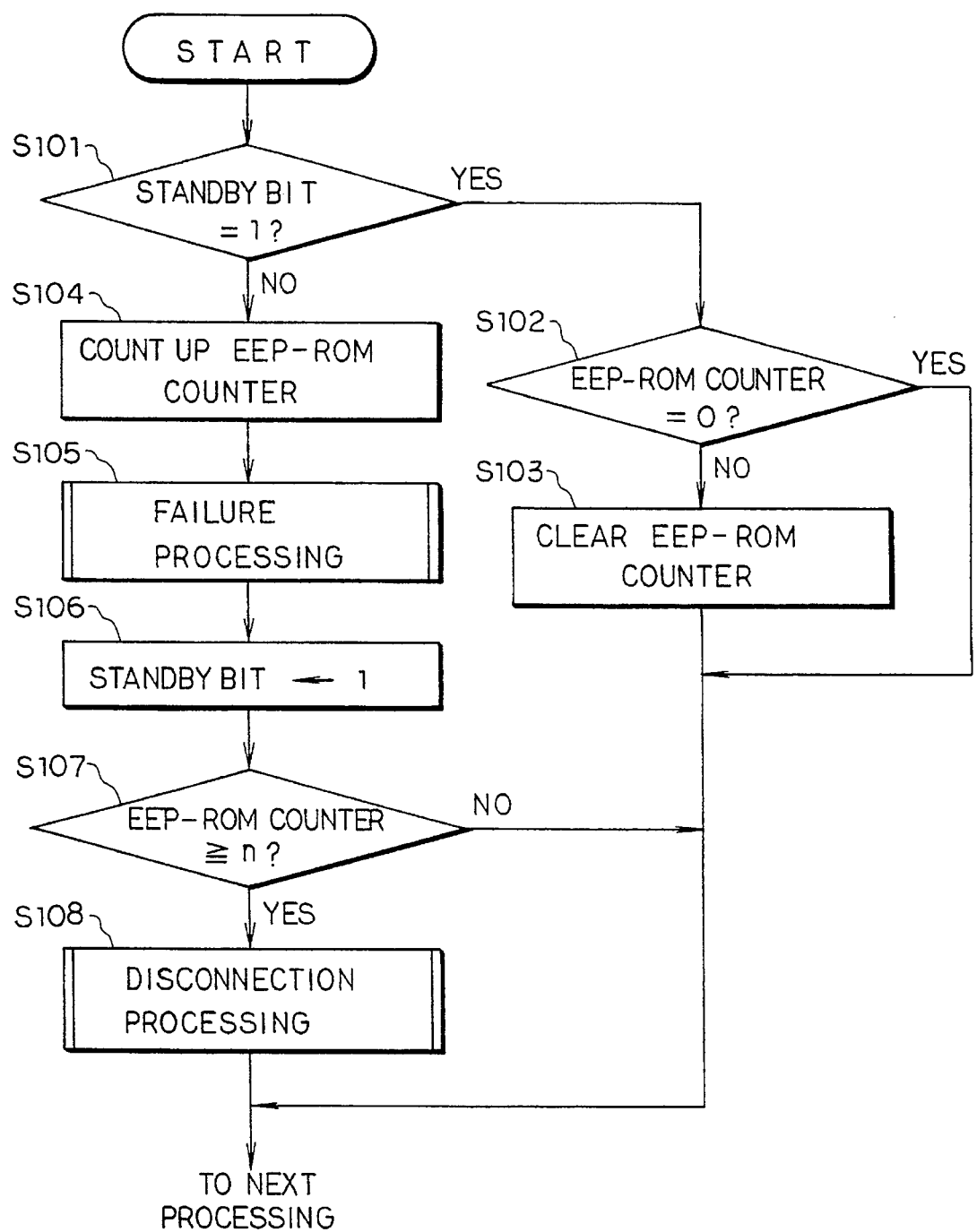
FIG. 2 is a flow chart illustrating a disconnection judgement procedure performed by a CPU in the first embodiment.
Figure 3:
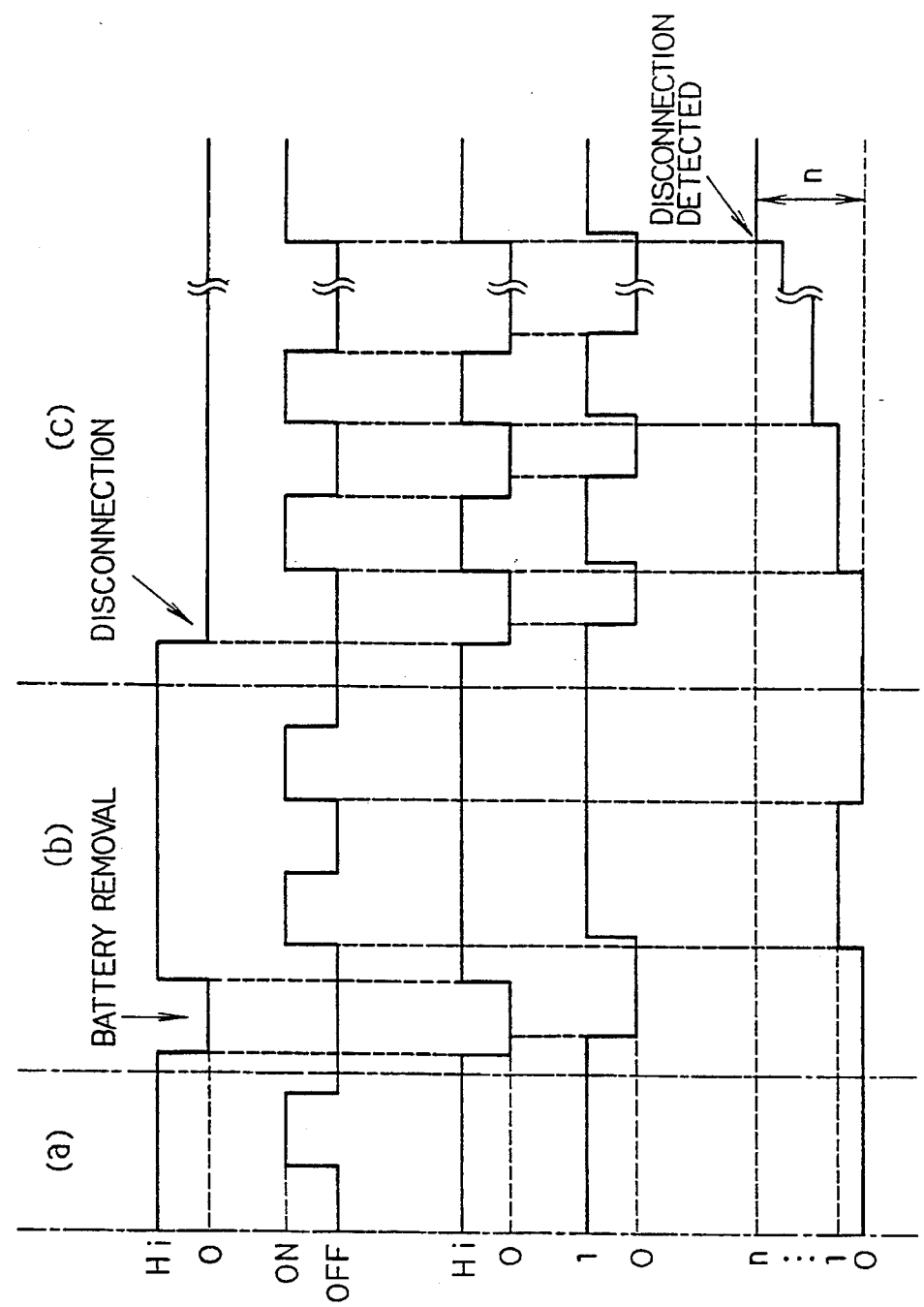
FIG. 3A–3E are timing charts illustrating a disconnection judgement procedure in the first embodiment.

In this embodiment, the disconnection judgment operation is performed under the control of the CPU 6 as illustrated in a flow chart in FIG. 2 and timing charts in FIGS. 3A–3E. Here, this operation is performed after the IG switch 19 is turned ON, the ECU 5 is made operative and the initialization of the CPU 6 is completed. First, in Step S101, a judgement is made whether or not the standby bit of the CPU 6 is "1." When the judgement is positive (YES), it judges that the electric power supply from the second electric power line 20 is not interrupted. That is, as indicated in a time domain (a) of FIGS. 3A–3E, when there is no temporary removal of the battery 1 for replacement or no disconnection of the second electric power line 20, the level of the standby voltage VSTBY remains high and does not fall, and therefore, the standby bit remains in the state of "1." Accordingly, in this state, it is judged that the electric power supply from the second electric power line 20 is not interrupted, and the process proceeds to Step S102.

In Step 102, a judgement is made whether or not the count of the counter in the EEP-ROM 10 is "0." When the judgement is positive, the next processings including the computation of the fuel injection quantity is performed using sensor outputs from the devices 2 and the learned control constants computed and stored in the backup RAM 13 during the previous operation of the engine. When the judgement is negative (NO), the next processings including the computation of the fuel injection quantity are performed after the count of the counter in the EEP-ROM 10 is cleared in Step S103. That is, when the count of the counter in the EEP-ROM 10 is "0," as the process proceeds to the next step without rewriting the data in the EEP-ROM 10, the number of times of rewriting the data can be minimized. Accordingly, there is no problem in using the EEP-ROM 10 even if it is limited in the number of times of rewriting the data.

On the other hand, in Step S101, when the standby bit of the CPU 6 is not "1," i.e., when the standby bit has changed from "1" to "0," it is judged that the electric power supply from the second electric power line 20 is interrupted for some reason. That is, as indicated in time domains (b) and (c) of FIGS. 3A–3E, when the battery 1 is temporarily removed for replacement or the electric power line 20 is disconnected, the standby voltage VSTBY falls below the reference level for the preset time, and the standby bit of the CPU 6 changes from "1" to "0." Accordingly, in this state, it is judged that the electric power supply from the second electric power line 20 is interrupted, and the process proceeds to Step S104.

In Step S104, the count of the counter in the EEP-ROM 10 is counted up. Then, in Step S105, a series of so-called fail processings are performed, i.e., the data including the learned control constants in the backup RAM 13 are set to the initial value (default value). That is, as the electric power supply from the second electric power line 20 has been interrupted and the data including the learned control constants in the backup RAM 13 have been destroyed, these data in the backup RAM 13 are set to the most standard values which may have little effect on the subsequent operation processings.

Next, in Step S106, the standby bit of the CPU 6 is reset to "1." Then, in Step S107, a judgement is made whether or not the count of the counter in the EEP-ROM 10 has reached or exceeded the number n, i.e., whether or not the interruption of the electric power supply from the second electric power line 20 has been detected consecutively for the number of times n (n=4) or more. When the judgement is negative, the process proceeds to the following processings including the computation of the fuel injection quantity. Here, in the following step, the operation processing is performed based on the data including the learned control constants in the backup RAM 13. Here, the learned control constants had been destroyed due to the interruption of the electric power supply from the second electric power line 20 and initialized. Accordingly, as the data of the destroyed learned control constants are not used for operation processing without any further processing, the operation processing can be performed with little trouble.

In the above step, Step S107, if the count reaches or exceeds the number n, it is judged that the interruption of the electric power supply from the second electric power line 20 is continuously caused by the disconnection of the electric power supply line 20, or the like. Then, in Step S108, the disconnection is processed including the turning ON of the warning lamp 3.

For instance, as indicated in the time domain (b) of FIGS. 3A–3E, when the battery 1 is removed temporarily for replacement, the level of the standby voltage VSTBY falls and the standby bit changes from "1" to "0." Accordingly, when the IG switch 19 is turned ON subsequently, the count of the counter in the EEP-ROM 10 is counted up to "1." However, when the IG switch 19 is turned ON again, as the standby bit has been reset to "1," it is judged that the interruption of the electric power supply previously detected is only temporarily caused by the replacement of the battery 1, or the like, and the process proceeds to Step S102 in FIG. 2. In this step, Step S102, as the count of the counter in the EEP-ROM 10 is "1," the process proceeds to Step S103, and the count is cleared to "0," and then the process proceeds to the next processing.

When the interruption of the electric power supply is temporarily caused by the removal of the battery 1 for replacement, or the like, the engine is controlled with little trouble based on the learned control constants initialized and stored in the backup RAM 13 only when the operation of the engine is started next time. For the subsequent starts of the engine, the engine is controlled normally and properly based on the newest learned control constants computed during the previous operation of the engine and stored in the backup RAM 13.

On the other hand, as indicated in the time domain (c) of FIGS. 3A–3E, when the interruption of the electric power supply is caused by the disconnection of the second electric power line 20 or the intermittent contact of the fourth terminal 21, the level of the standby voltage VSTBY falls and the standby bit changes from "1" to "0," as is the case with the above-described temporary removal of the battery 1. Accordingly, when the IG switch 19 is turned ON subsequently, it is judged that the electric power supply is interrupted, and the count of the counter in the EEP-ROM 10 is counted up. Then, whenever the IG switch 19 is turned ON again, it is judged that the electric power supply is interrupted and the count of the counter in the EEP-ROM is continuously counted up. When the above count reaches or exceeds the preset number n, it is judged that the interruption of the electric power supply has been continuously caused by the disconnection of the second electric power line 20, or the like, and the disconnection is processed including the turning ON of the warning lamp 3. As a result, by visually confirming that the warning lamp 3 is ON, the operator can exactly recognize the disconnection of the second electric power line 20 or the intermittent contact of the fourth terminal 21, and can immediately cope with the disconnection or the like.

In this embodiment, as described above, when the electric power supply from the second electric power line 20 is interrupted, the data including the learned control constants in the backup RAM destroyed by the interruption of the electric power supply is initialized, and the engine is controlled based on the initial value, etc. Therefore, the destroyed data of the learned control constants are not used for the engine control without any further processing. As a result, the engine can be controlled with little trouble.

Furthermore, in this embodiment, when the electric power supply is interrupted as described above, it can be exactly detected whether or not the interruption has been continuously caused by the disconnection of the second power electric line 20, or the like. When the disconnection is detected, the warning lamp 3 is turned ON to alarm the disconnection. Accordingly, by visually confirming the lighting of the warning lamp 3, the operator can exactly recognize the disconnection of the second electric power line 20, or the like, and can immediately cope with the disconnection or the like.

Moreover, in this embodiment, the EEP-ROM 10 which can hold the stored data even when the electric power supply is interrupted as a memory for storing the number of times of the electric power supply interruptions. Accordingly, regardless of the position of the IG switch 19 and the removal of the battery 1, the results of the detection of the electric power supply interruptions can be stored accurately and held in the EEP-ROM 10, whereby the continuous interruption of the electric power supply caused by the disconnection or the like can be exactly judged. In addition, as the electric power supply is not interrupted so often and the number of times of rewriting the data in the EEP-ROM 10 is minimized in the judgment made in the Step S102 in FIG. 2, there is no possibility that the data in the EEP-ROM 10 is rewritten so often. Accordingly, there will be no trouble, even when the EEP-ROM 10 which is limited in the number of times of rewriting the data is used for the judgment of the disconnection or the like.

In addition, in this embodiment, the interruption of the electric power supply is detected by using the standby bit provided in the CPU 6. Therefore, as any special-purpose circuit for detecting the interruption is not required to detect the interruption of the electric power supply, the production cost can be reduced by simplifying the composition.

Figure 4:
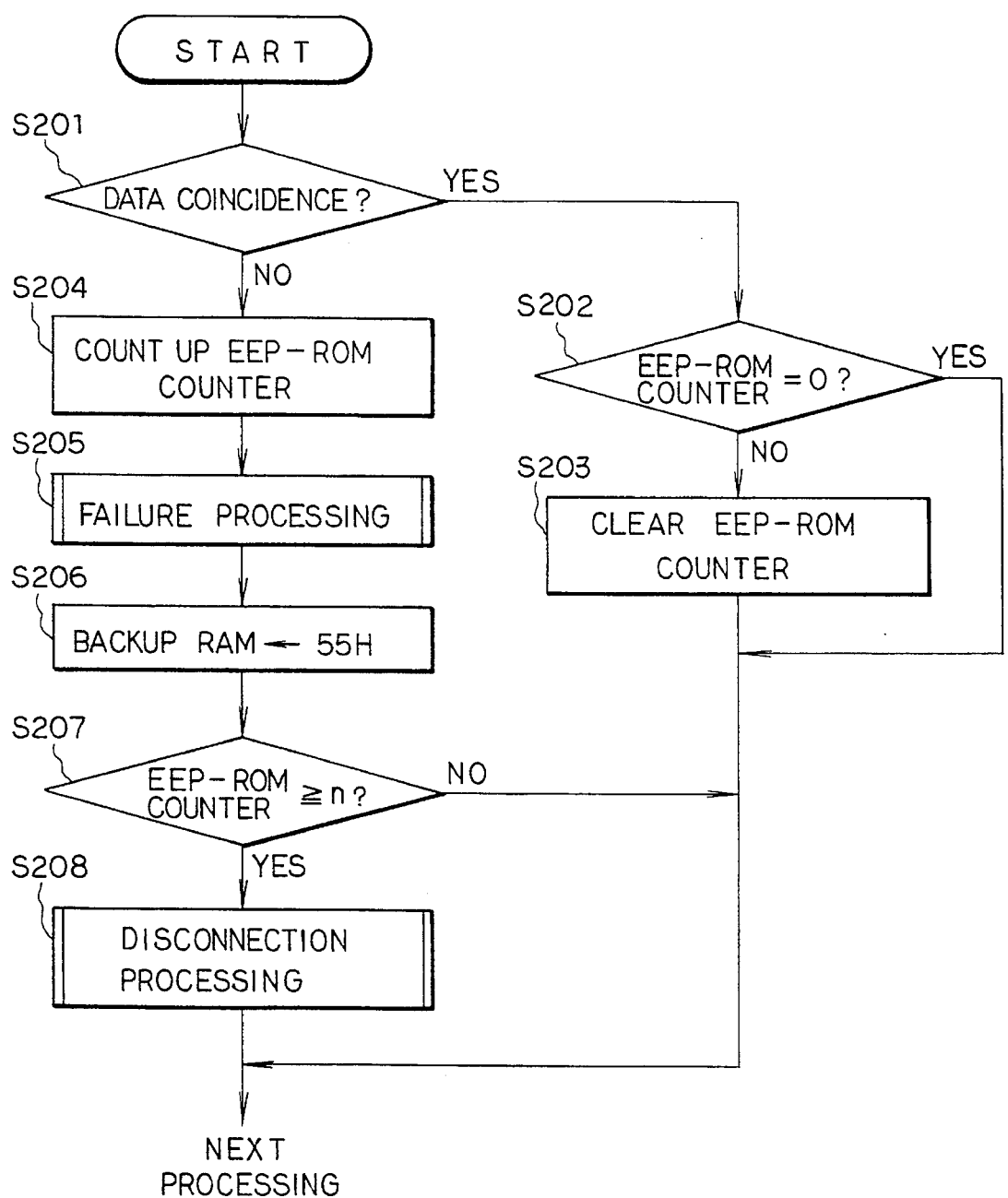
FIG. 4 is a flow chart illustrating a disconnection judgement procedure in a second embodiment of a battery disconnection detecting apparatus according to the present invention.

Next, a second embodiment according to the present invention will be described referring to FIG. 4.

In the second embodiment, as compared with the above first embodiment, there is a difference in the means for detecting the interruption of the electric power supply from the second electric power line 20. That is, in the second embodiment, the data including the same preset control constants and counts have been written both in the ROM 7 and in the backup RAM 13. When the IG switch 19 is turned ON and the ECU 5 is made operative, the CPU 6 compares the data including the control constants stored both in the ROM 7 and in the backup RAM 13 with each other. When the data are different between the ROM 7 and the backup RAM 13, the CPU judges that the electric power supply from the second electric power line 20 is interrupted. In this second embodiment, the CPU 6, the ROM 7 and the backup RAM 13 compose interruption detecting means.

Next, the procedure for the judgment of the disconnection performed under the control of the CPU 6 in this second embodiment will be described referring to the flow chart in FIG. 4. Here, the procedure is performed after the IG switch 19 is turned ON, the ECU 5 is made operative and the CPU 6 is initialized, as in the above first embodiment. Specifically, in Step S201, it is judged whether or not the data written both in the ROM 7 and in the backup RAM 13 are the same as each other. It is assumed, however, that a control constant "55H," for example, has been written both in the ROM 7 and in the backup RAM 13 as comparative data. When the judgment is positive, it is judged that the electric power supply from the second electric power line 20 is not interrupted, and the process proceeds to Step S202.

In Step S202 and the following step, Step S203, as in Steps S102 and S103 in the above first embodiment, a judgment is made whether or not the count of the counter in the EEP-ROM 10 is "0." When the judgment is negative, the count is cleared, and then the following processings including the computation of the fuel injection quantity are performed.

On the other hand, in Step S201, when the data in the ROM 7 and the backup RAM 13 are judged not the same as each other, it is judged that the electric power supply from the second electric power line 20 is interrupted. That is, when the battery 1 is temporarily removed or the second electric power line 20 is disconnected, the data in the backup RAM 13 are destroyed, and a control constant changes from a value "55H," for example, to a value "12H." Accordingly, in this case, it is judged that the electric power supply from the second electric power line 20 is interrupted, and the process proceeds to Step S204.

In Step S204 and the following step, Step S205, as in Steps S104 and S105 in the above first embodiment, the fail processings are performed including the counting up of the count of the counter in the EEP-ROM 10 and the initializing of the data including the learned control constants in the backup RAM 13.

Next, in Step S206, the destroyed data in the backup RAM 13 is reset to the original value "55H," for example. Then, in Step S207 and the following step, Step S208, as in Steps S107 and S108 in the above first embodiment, it is judged whether or not the count of the counter in the EEP-ROM 10 reaches or exceeds the preset number n. When the judgment is positive, the disconnection processings are performed including the turning ON of the warning lamp 3, and then the process proceeds to the following step.

As described above, in the second embodiment, the interruption of the electric power supply from the second electric power line 20 is detected by comparing the data stored in advance both in the ROM 7 and in the backup RAM 13 with each other. Accordingly, as in the above first embodiment, as the second embodiment does not require any special-purpose interruption detection circuit to detect the interruption of the electric power supply, the production cost can be reduced by simplifying the composition.

It is to be noted that the effects of the operation are the same as those of the above first embodiment. That is, the destroyed data including the learned control constants in the backup RAM 13 are not used for the operation processing without any further processing; that the interruption of the electric power supply is continuously caused by the disconnection or the like is exactly detected and then disconnection processings are performed including the turning ON of the warning lamp 3; and the EEP-ROM 10 can be used for judging the disconnection or the like with little trouble.

Furthermore, in the second embodiment, even when the stored data are destroyed due to the abnormality of the backup RAM 13, the disconnection may be detected because of comparison of data in the backup RAM 13 and in ROM 7. Accordingly, in the performance of the program indicated in the flow chart in FIG. 4, if the disconnection is detected, it is acceptable that the subsequent steps of the program indicated in the flow chart of FIG. 2 are implemented to confirm whether or not the detected disconnection is due to the abnormality of the backup RAM 13.

Although only two embodiments of the present embodiment have been described herein, it should be apparent to those skilled in the art that the present invention may be embodied in many other forms including the following without departing from the spirit or scope of the invention.

(1) In the second embodiment, the data for detecting the interruption of the electric power supply may be written both into the EEP-ROM 10 and into the backup RAM 13 instead of into the ROM 7.

(2) The preset count n of the EEP-ROM 10, which is used as the reference for the judgment of the disconnection, may be changed accordingly.

It should be understood from the above description that the present invention has an excellent effect that when the electric power supply from the battery to the storage device is interrupted, it can accurately be detected whether or not the interruption is continuous due to the disconnection or the like.

We claim:

1. A battery disconnection detecting apparatus for detecting disconnection of a storage battery providing electric power to said apparatus, said apparatus comprising:

a first storage device for storing and for holding variable first data while said first storage device is supplied with electric power;

a second storage device for storing and for holding second data even when not supplied with electric power;

a first electric power supply line for supplying electric power from said battery through an electric power switch to said second storage device;

a second electric power supply line for continuously supplying electric power from said battery to said first storage device;

controlling means for storing said first data in said first storage device and for performing operation processing using the first data stored in said first storage device;

interruption detecting means for detecting an interruption of the electric power supply through said second electric power supply line to said first storage device;

means for storing, as said second data, a number of interruptions detected by said interruption detecting means; and disconnection detecting means for detecting a continuous disconnection of said second electric power supply line from said storage battery based on the stored number of interruptions.

2. A disconnection detecting apparatus for vehicles having a storage battery providing electric power, a power switch and a control device, said apparatus for detecting continuous disconnections of said battery to said apparatus, said apparatus comprising:

first memory means for storing and holding data when supplied with electric power;

second memory means for storing and holding data even when not supplied with electric power;

a first power supply line connected to said battery and to said second memory means through said power switch for supplying electric power from said battery to said second memory means when said power switch is in a closed position;

a second power supply line connected to said battery and to said first memory means for supplying electric power from said battery to said first memory means; and central processing means connected to said first power supply line, said central processing means programmed to perform the steps of:

controlling said control device using said data stored in said first memory means, renewing said data stored in said first memory means during operation of said central processing means, detecting a disconnection of said second power supply line to said first memory means, counting and storing, as said data stored in said second memory means, a number disconnections detected, and judging whether the detected disconnection is a continuous disconnection based on said data stored in said second memory means.

3. A disconnection detecting apparatus according to claim 2, wherein said processing means is also programmed to perform the step of clearing the number of disconnections stored in said second memory means each time connection of said second power supply line is detected when said power switch is set to the closed position.

4. A disconnection detecting apparatus according to claim 2, wherein said processing means is also programmed to perform the step of resetting said data stored in said first memory means to a first predetermined value only when said number of disconnections stored in said second memory means exceeds a second predetermined value.

5. A disconnection detecting apparatus according to claim 2, wherein said processing means is also programmed to perform the step of detecting said disconnection by monitoring voltage drop on said second power supply line.

6. A disconnection detecting apparatus according to claim 2, wherein a constant reference value is initially stored both in said first memory means and in said second memory means and wherein said processing means is further programmed to perform said step of detecting a disconnection by comparing said constant reference value stored in said first memory means with said reference value stored in said second memory means.

7. A disconnection detecting apparatus according to claim 2, wherein said first memory means includes a random access memory and said second memory means includes an electrically erasable program memory.

8. A battery disconnection detecting apparatus for determining whether interruption of electrical power supplied to a battery is caused by continuous disconnection of an electrical power line connecting said apparatus to said battery, said apparatus comprising:

a plurality of power supply lines connected to said battery;

memory means for storing data, said memory means connected to said plurality of power supply lines to obtain electric power from said battery; and control means for:

controlling devices based upon said data, detecting interruption of electric power via of one of said plurality of power supply lines, and communicating with said memory means to determine, based on previously detected interruptions of electric power, whether said detected interruption is caused by a continuous disconnection of said electric power.

9. A battery disconnection detecting apparatus as claimed in claim 8, wherein said plurality of power supply lines include first and second power supply lines, wherein said first power supply line is connected to said battery via a power switch and supplies electric power when said power switch is in a closed position, and wherein said second power supply line is connected to said battery and supplies electric power irrespective of the position of said power switch.

10. A battery disconnection detecting apparatus as claimed in claim 9, wherein said memory means includes first memory means connected to said second power supply line and second memory means connected to said first power supply line, wherein said first memory means stores data continuously when electric power is supplied thereto, and wherein said second memory means stores data when electrical power is supplied thereto and holds said stored data without electrical power being supplied thereto.

11. A battery disconnection detecting apparatus as claimed in claim 10, wherein said control means is connected to said first power supply line and uses said data stored in said first memory means for said controlling, and wherein said control means detects interruption of said second power supply line and inputs data associated with said detected interruption to said second memory means each time said power switch is set to the closed position.

12. A battery disconnection detecting apparatus as claimed in claim 11, wherein said control means further includes means for clearing said second memory means when said second power supply line is connected by said power switch being turned to the closed position.

13. A battery disconnection detecting apparatus as claimed in claim 11, wherein said control means further includes means for resetting data held in said second memory means to a predetermined value.

14. A battery disconnection detecting apparatus as claimed in claim 11, wherein said control means further includes means for detecting said disconnection by monitoring a voltage drop along said second power supply line.

15. A battery disconnection detecting apparatus as claimed in claim 11, wherein said first memory means stores a constant reference value, and wherein said control means includes means for detecting disconnection by comparing said stored constant reference value with a reference value stored in said second memory means.

16. A battery disconnection detecting apparatus as claimed in claim 11, wherein said first memory means includes a random access memory and said second memory means includes an electrically erasable programmable memory.

\* \* \* \* \*